United States Patent [19]

Wallgren et al.

[11] Patent Number: 5,152,447
[45] Date of Patent: Oct. 6, 1992

[54] HOT GAS JET DEVICE FOR INSTALLING AND REMOVING COMPONENTS WITH RESPECT TO A SUBSTRATE AND IMPROVED TIP FOR USE THEREWITH

[75] Inventors: Linus E. Wallgren; Eric S. Siegel, both of Rockville, Md.

[73] Assignee: Pace, Incorporated, Laurel, Md.

[21] Appl. No.: 821,135

[22] Filed: Jan. 16, 1992

Related U.S. Application Data

[63] Continuation-in-part of Ser. No. 517,210, Apr. 26, 1990, abandoned.

[51] Int. Cl.$^5$ .............................................. B23K 3/04
[52] U.S. Cl. ..................................... 228/4.1; 228/6.2; 239/538; 239/562
[58] Field of Search ..................... 228/20 R, 20 HT; 392/379, 383, 384; 239/579, 581.1, 538, 133, 135, 562

[56] References Cited

U.S. PATENT DOCUMENTS

| | | | |
|---|---|---|---|
| 3,130,286 | 4/1964 | Lenzi | 228/20 |
| 3,237,872 | 3/1966 | Mincy | 239/538 |
| 3,420,430 | 1/1969 | Goetz et al. | 228/47 |
| 3,603,329 | 9/1971 | White et al. | 228/20 R |
| 3,868,764 | 3/1975 | Hartleroad et al. | 228/6.2 |
| 4,564,135 | 1/1986 | Barresi et al. | 228/242 |
| 4,925,097 | 5/1990 | Corrigan | 251/345 X |

FOREIGN PATENT DOCUMENTS

| | | | |
|---|---|---|---|
| 202351 | 11/1986 | European Pat. Off. | 228/240 |
| 146320 | 3/1989 | U.S.S.R. | 239/581.1 |
| 2157977 | 11/1985 | United Kingdom | 239/562 |

OTHER PUBLICATIONS

Karl Leister, *Contactless de-soldering and soldering of SMD- and DIP-Components between 20° and 600° C. with the electronically controllable hot air stream of the Leister Hot-Jet*, Leaflet 51C.

Primary Examiner—Kenneth J. Ramsey
Attorney, Agent, or Firm—Sixbey, Friedman, Leedom & Ferguson

[57] ABSTRACT

A device for installing or removing a component with respect to a substrate utilizing hot gas jets or other hot gas flow to reflow solder associated with the component. The device includes an improved tip mounted with respect to a hot gas supply, the tip including (a) a manifold member having an inlet bore mountable with respect to the hot gas supply, and one or more manifolds connected to the inlet bore, each manifold having at least one opening in a side thereof, and (b) at least one nozzle member including a sleeve with an opening in the side thereof, and a hollow nozzle connected to the sleeve and having an opening at the distal end thereof, the sleeve being rotatably mountable on the manifold to effect selective engagement of the opening in the sleeve with the opening in the manifold so that, in a first rotated position of the sleeve with respect to the manifold, the opening in the manifold communicates with the opening in the sleeve to effect a hot gas jet passage from the hot gas supply to the nozzle opening via the inlet bore, the manifold, and the nozzle and, in a second rotated position of the sleeve with respect to the manifold, communication between the opening in the manifold and the opening in the sleeve is substantially blocked to thus prevent formation of the hot gas jet passage. A plurality of nozzle members may be provided on each manifold member such that the length of the jet may be adjusted. Moreover, two manifolds may be arranged in parallel to apply the hot jets to terminals at the opposite sides of a component or they may be orthogonally disposed with respect to each other to apply the jets to terminals at adjacent sides of the component. Furthermore, two of the tips having orthogonally disposed manifolds may be adjustably mounted with respect to each other to apply hot jets to four sides of a component.

47 Claims, 4 Drawing Sheets

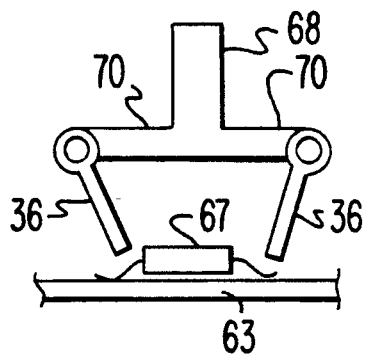
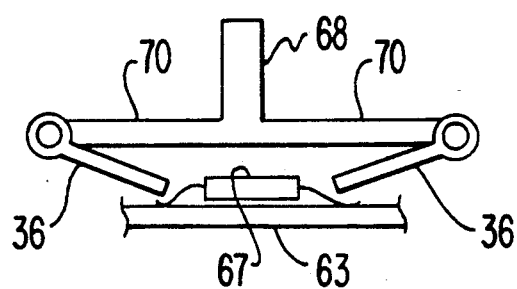
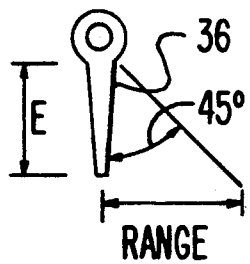
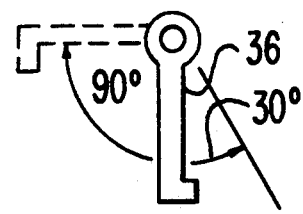
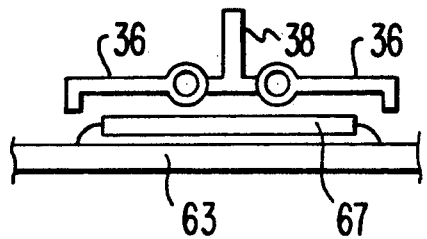
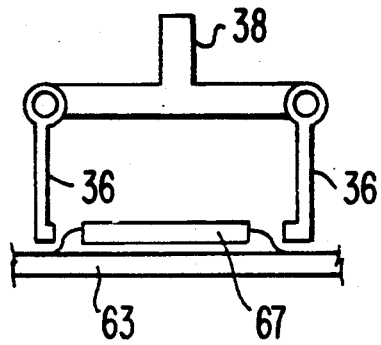

HOT GAS JET DEVICE FOR INSTALLING AND REMOVING COMPONENTS WITH RESPECT TO A SUBSTRATE AND IMPROVED TIP FOR USE THEREWITH

This application is a continuation-in-part of Ser. No. 07/517,210, filed Apr. 26, 1990, now abandoned.

TECHNICAL FIELD

The present invention is directed to a device for installing and removing components with respect to a substrate such as a printed circuit board using hot air jets to melt solder associated with the components and a tip for use with such a device. More particularly, the present invention is directed to a device and a tip for use therewith having one or more rotatable nozzles for directing hot air jets to precise locations to install or remove various types and sizes of components with respect to a substrate.

BACKGROUND AND SUMMARY OF THE INVENTION

In general, the devices of the present invention are typically usable with components mounted on a substrate such as a PCB where such components include surface mounted devices (SMD's) and thru-hole devices, sockets, plugs, connectors, heat sinks, etc. where the component may have leads or terminals at one or more sides thereof, it being understood that the terms "leads" and "terminals" are used interchangeably hereinafter. Moreover, in general, a substrate such as a PCB includes anything not a component such as ground and voltage planes, all circuitry, laminates, conformal coatings, board stiffeners, etc.

Component operations include removal, installation, replacement, re-positioning, adding solder, removing solder, reflowing solder, curing and/or overcuring adhesives and coatings, etc. When removing or installing certain components from a substrate in certain applications of the invention, it may be desirable to heat the leads or terminals of the component in order to melt the solder associated with the leads. In such instances, the metallized castellations of a so-called leadless chip carrier would be considered the leads or terminals of the component.

When installing or removing a component, it may be necessary to melt solder associated with the leads thereof. In such instances, the solder is considered to be reflowed regardless of whether the component is being installed or removed. Moreover, although reference is made to the use of hot gas jets herein, it should be understood the invention also extends to other forms of hot gas flow suitable for solder reflow.

With the foregoing definitions in mind, the invention and the background thereof will now be described in terms of specific applications, it being understood, there is no intent to limit the invention to such applications. Rather, the scope of the invention extends to the wide variety of applications suggested by the above definitions and other applications which will occur to those engaged in this art.

With the increasing miniaturization of electronic assemblies, more electronic components are being mounted on printed circuit boards such that the spacing between adjacent components has, in many instances, become quite small (as small as 10 mils, for example). This poses a difficulty when attempting to remove and replace a defective component in that the joints of adjacent good components may be damaged. That is, in applying a hot gas to melt the solder at the leads of a defective component, the gas may also be applied to the leads of an adjacent good component. Heating of adjacent leads, at temperatures approaching, although below, the liquidus point of solder, often causes solder crystallization which weakens the solder joint and eventually leads to joint failure. Ideally, the temperature of adjacent component solder should generally remain below approximately 160° C. With a safety margin, the temperature of adjacent components should remain below 150° C. (302° F.) for conventional, eutectic SN-63/PB-37 solder to avoid this problem.

Nozzles for use with hot gas devices to facilitate the installation or removal of components from printed circuit substrates are known. Such nozzles are disclosed in U.S. Pat. Nos. 4,605,153 and 4,659,004 both of which are assigned to the assignee of the present application and are incorporated herein by reference. The nozzles function well in their intended applications.

A primary object of the invention is the provision of an improved hot air, component installation/removal device which is capable of precisely directing the hot air jets even when the components are closely spaced.

Another characteristic of modern electronic assemblies is the wide variety of electronic components terms of types, shapes, and sizes, etc. Thus, not only is it desirable that a hot gas, component installation/removal device be capable of precisely directing hot gas jets, but also it is desirable that a single device be capable of directing such precise jets with respect to a wide variety of components. Accordingly, it is a further primary object of the present invention to provide a device of the foregoing type and improved tips for use therewith.

Devices are known in the prior art which utilize a hot gas jet such as U.S. Pat. No. 3,970,234, assigned to the assignee of the present application and incorporated herein by reference. Another device which utilizes a hot air jet is sold by Karl Leister as the "Leister Hot-Jet Hot Air Blower" and includes a large number of nozzle types removably attachable to a hot air blower to thus provide a hot air jet capability with respect to a large number of components. However, as indicated above, it is a primary object of the present invention to provide an improved hot gas jet device which avoids the need and expense of providing a large number of nozzles.

Other prior art of interest is U.S. Pat. Nos. 3,420,430; 3,868,764; 3,603,329; 3,130,286; and 4,564,134.

The foregoing objects and other objects of the invention will be apparent from a reading of the following description and claims in conjunction with the drawings.

BRIEF DESCRIPTION OF THE DRAWINGS

FIGS. 6 and 7 are end views of the embodiment of FIG. 4, showing different relative positions of the nozzle members.

FIGS. 8 and 9 are end views illustrating angles of operation for straight and curved nozzles.

FIGS. 10 and 11 are schematic views illustrating different modes of operation for curved nozzles.

DETAILED DESCRIPTION OF PREFERRED EMBODIMENTS

Figure 1:
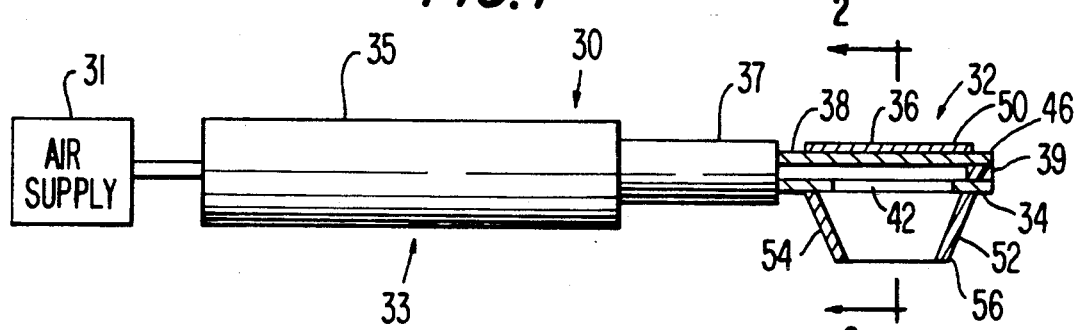
FIG. 1 is a partial sectional view of an illustrative hot air jet installation and removal device with an improved single manifold tip in accordance with the invention.

Referring to FIG. 1, a single manifold embodiment of the component installation and removal device 30 of the present invention is shown where the device comprises an air (or other gas) supply 31 and a hand held heating device 33, such as the desoldering devices disclosed in U.S. Pat. Nos. 4,269,343 and 4,439,667, which are assigned to the assignee of the subject application and which are incorporated herein by reference. As is known, hand held heating device 33 may comprise a handle 35 and tubular heater 37. Conventionally, a tubular tip is removably insertable within tubular heater 37 to facilitate either desoldering or hot air jet procedures depending on whether air supply 31 is operated in a vacuum or pressurized air mode.

In accordance with the present invention, the conventional tip may be replaced with an improved tip 32, which may also be removably insertable with tubular heater 37, tip 32 being shown in cross section in FIG. 1. However, it should be understood that the tip of the present invention may be attached, either removably or non-removably, with respect to any hot air supply, which may or may not be portable. Moreover, the air supply may be of any type including line air, a small diaphragm pump, etc.

The basic components of tip 32 are manifold member or means 34 and nozzle member or means 36. Manifold member 34 includes two basic portions, inlet bore 38 and manifold 40 where manifold 40 has an opening or longitudinally extending elongate slot 42 disposed in the side thereof, as can also be seen in FIG. 2, where the slot serves as an exit orifice for hot gas passing through the manifold. Moreover, manifold 40 may be formed as a closed end tube or may be formed as an open end tube with the end thereof closed by a plug 39.

In the embodiment of FIG. 1, only one manifold 40 is provided, although as will be discussed below with respect to double manifold embodiments of the invention, a single tip 32 may include a plurality of manifolds 40 to simultaneously heat solder along more than one side of a component.

Figure 2:
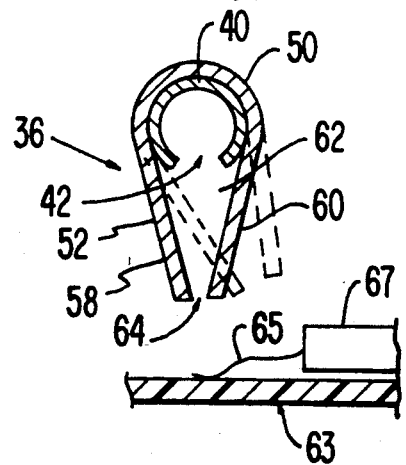
FIG. 2 is a cross-sectional view of the device of FIG. 1 taken along line 2—2.

Nozzle member 36 is, rotatably mounted on manifold 40 of tip 32, as shown in FIG. 1 and FIG. 2. Nozzle member 36 includes a sleeve or cylindrical mounting portion 50 to facilitate removable mounting of nozzle member 36 with respect to the manifold 40 although the nozzle member may also be non-removably mounted with respect to the manifold. Nozzle member 36 also includes a nozzle or jet directing outlet portion 52. As shown in FIG. 1, edges 54, 56 of nozzle 52 may be inwardly inclined toward each other and, as shown in FIG. 2, side walls 58, 60 may converge toward each other to form a V-shaped nozzle and to provide precise directional accuracy for the hot gas jets exiting nozzle member 36 onto the solder at the terminals 65 of a component 67 mounted on a substrate 63, it being understood any other nozzle shape which provides a hot gas jet or other flow of hot gas may also be employed. Nozzle member 36 is rotatable on manifold 40 to selectively engage elongate slot 42 to complete a fluid passageway for the discharge of a hot air jet from tip 32. Nozzle member 36 also may be rotated to a position where it blocks elongate slot 42 to prevent the hot gas jet from exiting nozzle member 36. The outlet 64 of nozzle member 36 may have a length measured in a direction parallel to the longitudinal axis of manifold 40, sufficient to heat and melt solder along an entire side of a component.

Figure 3:
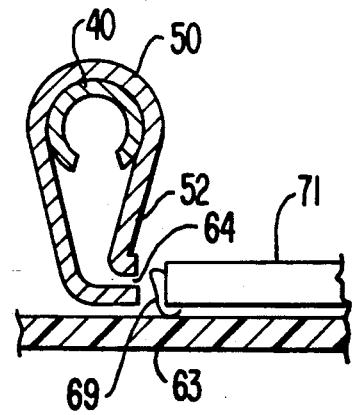
FIG. 3 is a cross-sectional view similar to that of FIG. 2 of a curved nozzle embodiment of the apparatus.

As shown in FIG. 3, outlet 64 of nozzle member 36 may be formed with a curved nozzle passageway 66 to more precisely direct hot air jets onto terminals 69 at the side of a component 71 where the component would typically be of the J-leaded or leadless type but which also could be of the gull-wing type shown in FIG. 2. The straight nozzle of FIG. 2 is particularly adapted to directing hot air jets to the gull-wing type leads when vertically oriented as shown in solid lines in FIG. 2. When nozzle member 36 is rotated such as to the dotted line position shown in FIG. 2, the hot air jet may also be directed to the sides of a J-leaded or leadless type component such as that of FIG. 3. When the nozzle is so rotated or when a curved nozzle such as that of FIG. 3 is employed, the hot air jet is advantageously also directed away from the leads of adjacent components.

Figure 3A:
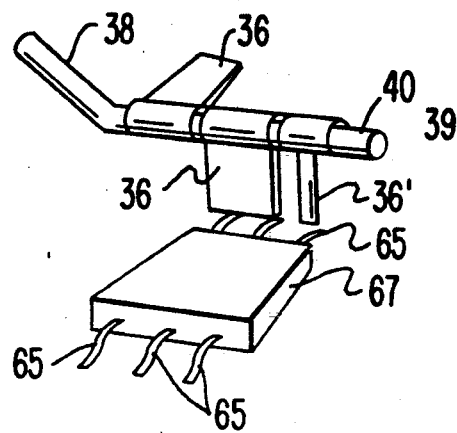
FIG. 3A is a perspective view of a further single manifold embodiment of the invention.

Reference is now made to FIG. 3A, which illustrates a further single manifold embodiment of the invention, which provides great flexibility for the installation/removal of almost all components. The inlet bore 38 is inclined with respect to manifold 40 whereas in the FIG. 1 embodiment the inlet bore and manifold are aligned. The FIG. 3A embodiment is advantageous when used with hand held heating devices in that the angle between the bore and manifold can be so selected as to optimize operator comfort and efficiency in directing hot gas jets to solder to be reflowed.

Rotatably mounted on the manifold are a plurality of nozzle members 36 where each manifold may have a plurality of vents or openings 42 respectively associated with the plurality of nozzle members. By using a plurality of nozzle members 36, the length of the jets may be varied by opening and closing off the vents 42. Thus, as shown in FIG. 3A, one of the two nozzle members 36 is used reflow solder at leads 65 of component 67. The other nozzle member 36 may be rotated to close off the remaining vent 42 (or the remainder of elongate slot 42 if the manifold has a single slot opening as opposed to a plurality of openings). The length of manifold 40 can be selected as a function of convenience of use and accessibility.

Nozzle member 36' which also directs a hot gas jet to a single point such as a single terminal of component 67. This nozzle may also have a single vent associated therewith.

Any combination of nozzle members 36 and 36' can be disposed on manifold 40 to thus provide great flexibility for installation/removal of all components inasmuch as different nozzle members can be moved in or out of communication with their associated manifold vents. Furthermore, all terminals of a component need not necessarily be reflowed at the same time. Thus, with the single manifold tip of FIG. 3A, either successive terminals may be reflowed or successive sides of a component may be reflowed where, in the latter instance, all terminals at a given side of the component may be simultaneously reflowed.

In a further modification of the FIG. 3A single manifold tip, only one of the nozzles 36 or 36' is disposed on the manifold. The disposition of only single point nozzle 36' on the manifold is desirable in terms of flexibility and capability of limited space access.

All modifications described above with respect to the single manifold embodiments of FIGS. 1-3 are also are applicable to the single manifold embodiments described above.

Figure 4:
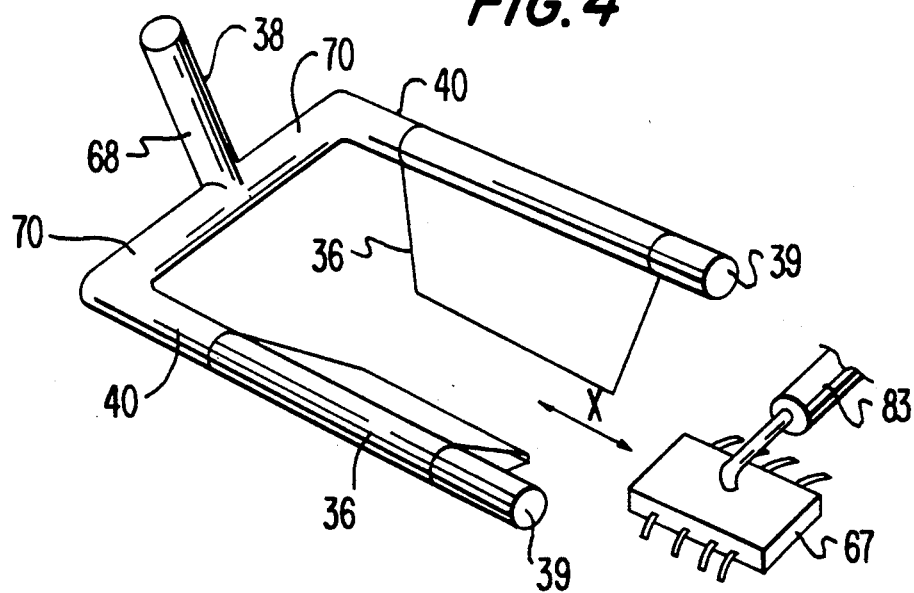
FIG. 4 is a perspective view of another embodiment of the invention using a double manifold tip.

FIG. 4 illustrates a double manifold embodiment in which two manifolds 40 extend from inlet bore 38. In this embodiment, inlet bore 38 is inclined with respect to manifolds 40, thereby permitting handpiece 35 to be held at a comfortable angle with respect to the component. Inlet bore 38 is bifurcated to include a relatively upright section 68 and two horizontal connecting sections 70 which extend outwardly from upright section 68 in opposite directions. One manifold 40 is formed on the end of each connecting section 70 in a direction approximately perpendicular to connecting section 70 such that the manifolds are substantially parallel. Although a perpendicular direction is preferred, it is not required. It is, however, preferred in this embodiment that manifolds 40 be parallel to each other and extend in the same direction as each other. Thus, the manifolds may form any angle with respective connecting sections 70 as long as the interior angles formed by both manifolds 40 (which are parallel) and both connecting sections 70 (which form a transversal) are preferably supplementary. This configuration of tip 32 facilitates the reflowing of solder along two opposite sides of a component. This is ideal for Small Outline Integrated Circuit (SOIC) surface mounted devices (SMD's), where the solder at all of the leads can be simultaneously reflowed. This configuration also allows complete visibility of the component in the Z direction (See FIG. 4) between manifolds 40 and also permits X direction access to the component between manifolds 40 with a vacuum pick 83 or the like to thus facilitate alignment, placement, and holding down of the component during solder reflow.

Figure 5:
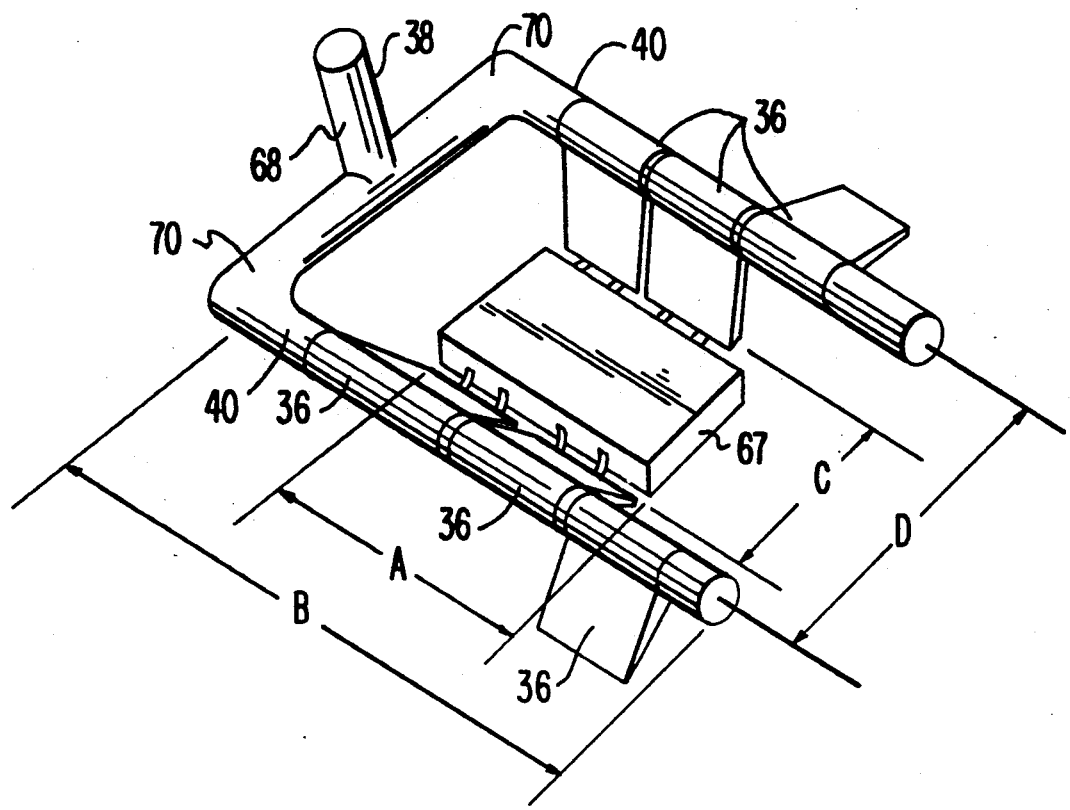
FIG. 5 is a perspective view of another embodiment of the FIG. 4 device.

FIG. 5 illustrates a modification of the embodiment of FIG. 4 in which a plurality of nozzle members 36 are mounted on each manifold 40 where each manifold may have a plurality of openings 42 respectively associated with the plurality of vents, this modification corresponding to that of FIG. 3A. By using a plurality of nozzle members 36, the jet length A may be varied by opening and closing off vents 42 as discussed above with respect to FIG. 3A. Thus, as shown in FIG. 5, two of a possible three nozzle members are used to heat the solder on the leads 65 of component 67. The remaining nozzle member 36 is rotated to close off the remaining vent 42 (or the remainder of elongate slot 42 if the manifold has a single slot opening as opposed to a plurality of openings). The manifold length B can be selected as a function of convenience of use and accessibility.

Moreover, the FIG. 5 embodiment (like the FIG. 4 embodiment) can be used with a wide range of component widths depending on the angle at which nozzle member(s) 36 are set to thus set a desired jet width C as indicated in FIG. 5. With respect to the manifold width D (FIG. 5), reference should be made to FIG. 6 where there is illustrated nozzle members 36 rotated to a desirable angle with respect to the leads of component 67. This angle is desirable in that component 67 can be reflowed without having to bring nozzle members 36 up at too high an angle (as illustrated in FIG. 7) thereby limiting accessibility when components are closely spaced on a board. Accordingly, manifold width D should be so selected that the full range of components to be reflowed for a given manifold width can be so reflowed without having to bring nozzle members 36 up at too high an angle. Thus, tips 32 desirably are available in different manifold widths such as small, medium, and large to thereby provide component reflow capability for not only a wide range of components widths but also a wide range of component lengths, as discussed above.

With respect to the nozzle length E (FIG. 8), this should preferably be equal to about the range over which the nozzle can desirably be rotated without impairing tight space accessibility as discussed above with respect to FIGS. 6 and 7. That is, since the angle of operation over which nozzle member 36 can desirably be rotated is about 45° before tight space accessibility is impaired, the nozzle length E is about equal to the range, as indicated in FIG. 8. However, it is to be understood that, depending on the application, any angle of operation (and nozzle length) may be appropriate.

With respect to the curved nozzle of FIG. 3, the angle operation preferably extends to about 30° in the direction of the opening 64 to about 90° in the opposite direction, as indicated in FIG. 9, where again, depending on the application, any angle of operation and nozzle length may be appropriate.

A further advantageous modification of the double manifold tip of FIG. 4 is effected by providing a single point tip 36' (FIG. 3A) on each of the manifolds 40 of the FIG. 4 tip to thus provide two single point jets for small components.

Referring to FIG. 10, an illustrative use of the curved nozzle corresponding to the dotted line position of FIG. 9, is diagrammatically indicated where the curved nozzle members 36 direct hot gas jets to the gull-wing leads of a component 67. In FIG. 11, the same gull-wing leads are heated with the curved nozzle members vertically oriented with respect to substrate 71. As discussed above with respect to FIG. 3, the vertical orientation of the curved nozzle members 36 is also very desirable with respect to the reflow of J-leaded and leadless type components.

Figure 12:
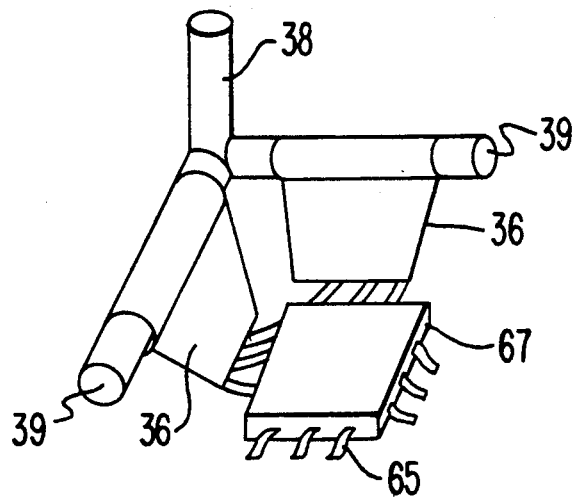
FIGS. 12 and 13 are perspective views of further double manifold embodiments in accordance with the invention.

FIG. 12 illustrates a further double manifold embodiment of tip 32 in which manifolds 40 are preferably substantially perpendicular to each other. In this double manifold embodiment, manifolds 40 may be connected to each other at their connection to inlet bore 38 to reflow leads at two adjacent sides of a component and may be sequentially used to reflow leads which extend from the other two adjacent sides of the component to thus reflow the leads at all four sides of the component.

Figure 13:
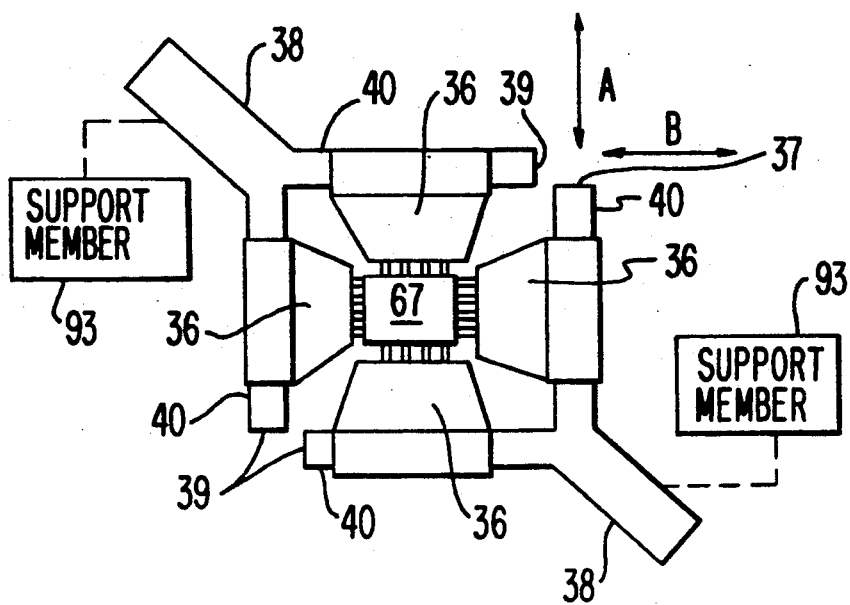

Referring to FIG. 13, there is illustrated a further embodiment where two of the FIG. 12 tips 32 are so arranged as to simultaneously provide hot air jets to all four sides of a component 67. Although each of the tips 32 may be connected to a hand held device 35, it is preferable to mount each tip with respect to a support member 93 such that the tips can be independently moved in the A and B directions to thus align the nozzle members 36 with the sides of component 67. As can be seen from FIG. 12, unrestricted Z axis viewability is provided.

What is claimed is:

1. A device for installing or removing a component with respect to a substrate utilizing hot gas jets or other hot gas flow to reflow solder associated with the components, said device comprising:
   a hand held soldering and desoldering device hot gas supply;
   a tip including
   manifold means including
   (a) an inlet bore mountable with respect to said hot gas supply and
   (b) at least one manifold connected to said inlet bore, said manifold having at least one opening in a side thereof; and
   at least one nozzle means including
   (a) a sleeve with an opening in the side thereof and
   (b) a hollow nozzle connected to the sleeve and having an opening at the distal end thereof, said sleeve being rotatably mountable on said manifold to effect selective engagement of the opening in the sleeve with the opening in the manifold so that, in a first rotated position of the sleeve with respect to the manifold, said opening in the manifold communicates with the opening in the sleeve to effect a hot gas jet passage from the hot gas supply to the nozzle opening via the inlet bore, the manifold, and the nozzle and, in a second rotated position of the sleeve with respect to the manifold, communication between the opening in the manifold and the opening in the sleeve is substantially blocked to thus prevent formation of said hot gas jet passage.

2. A device as in claim 1 where said inlet bore of the tip is removably mountable with respect to the hot gas supply.

3. A device as in claim 1 where said sleeve of the nozzle means is removably mountable with respect to the manifold.

4. A device as in claim 1 where said inlet bore and said manifold are aligned.

5. A device as in claim 1 where said inlet bore and said manifold are at an angle with respect to one another.

6. A device as in claim 1 where said manifold means includes only one manifold.

7. A device as in claim 1 where said manifold means includes at least two of said manifolds.

8. A device as in claim 7 where two manifolds are orthogonally disposed with respect to each other to thus provide the capability of hot gas jets at adjacent sides of said component.

9. A device as in claim 7 including two of said tips and support means for said tips to facilitate
   (a) alignment of the two manifolds of one of the tips with adjacent sides of a four sided component having terminals at all four sides thereof and
   (b) alignment of the two manifolds of the other of the tips with the other adjacent sides of the component.

10. A device as in claim 7 where said two manifolds are disposed in parallel with respect to each other to thus provide the capability of hot gas jets at opposite sides of said component.

11. A device as in claim 10, where only one said nozzle means is mounted on each said manifold.

12. A device as in claim 10 where said inlet bore is bifurcated, said two manifolds being connected to the bifurcated ends of the inlet bore.

13. A device as in claim 10 where the distance between the two parallel manifolds is such that a plurality of different sizes of said component can be installed or removed by the tip without having to rotate the nozzles past about 45° with respect to the vertical.

14. A device as in claims 6, 7, and 8, or 10 including only one said nozzle means mounted on at least one manifold.

15. A device as in claim 14 where the size of the nozzle opening is such that the solder associated with a single component terminal can be reflowed.

16. A device as in claims 6, 7, 8, or 10, including a plurality of said nozzle means rotatably mountable on at least one manifold.

17. A device as in claim 16 where the sizes of the openings of said nozzle means vary to facilitate the installation or removal of plurality of different components.

18. A device for installing or removing a component with respect to a substrate utilizing hot gas jets or other hot gas flow to reflow solder associated with the components, said device comprising:
    a hand held soldering and desoldering device hot gas supply;
    a tip including
    manifold means including
    (a) an inlet bore mountable with respect to said hot gas supply and
    (b) at least one manifold connected to said inlet bore, said manifold having at least one opening in a side thereof; and
    at least one nozzle means including
    (a) a sleeve with an opening in the side thereof and
    (b) a hollow nozzle connected to the sleeve and having an opening at the distal end thereof, said sleeve being rotatably mountable on said manifold to effect selective engagement of the opening in the sleeve with the opening in the manifold so that, in a first rotated position of the sleeve with respect to the manifold, said opening in the manifold communicates with the opening in the sleeve to effect a hot gas jet passage from the hot gas supply to the nozzle opening via the inlet bore, the manifold, and the nozzle and, in a second rotated position of the sleeve with respect to the manifold, communication between the opening in the manifold and the opening in the sleeve is substantially blocked to thus prevent formation of said hot gas jet passage, said device also including a plurality of said nozzle means rotatably mountable on at least one manifold and a plurality of said openings in the side of one manifold which are respectively associated with said plurality of nozzle means.

19. A device as in claims 6, 7, 8, or 10, where the size of the nozzle opening is sufficient to reflow solder associated with a plurality of terminals at the side of the component.

20. A device as in claim 6, 7, 8, or 10, where the size of the nozzle opening is such that the solder associated with only one terminal of the component can be reflowed.

21. A device as in claims 6, 7, 8, or 10, where the shape of the nozzle is such that the air flow path along the length thereof and out the nozzle opening is substantially linear.

22. A device as in claim 6, 7, 8, or 10, where the shape of the nozzle is such that the air flow path at some portion along the length thereof is curvilinear.

23. A device as in claim 22 where said nozzle is curved in the proximity of the nozzle opening 24. A device as in claim 22 where the curvature in the nozzle is such that the air flow is curved through approximately 90°.

25. A tip for installing or removing a component with respect to a substrate utilizing hot gas jets or other hot gas flow to reflow solder associated with the components, said tip having means for mounting of the tip to a hot gas supply of a hand held soldering and desoldering device, said tip comprising:
 manifold means including;
  (a) an inlet bore mountable with respect to said hot gas supply and
  (b) at least one manifold connected to said inlet bore, said manifold having at least one opening in a side thereof; and
 at least one nozzle means including
  (a) a sleeve with an opening in the side thereof and
  (b) a hollow nozzle connected to the sleeve and having an opening at the distal end thereof, said sleeve being rotatably mountable on said manifold to effect selective engagement of the opening in the sleeve with the opening in the manifold so that, in a first rotated position of the sleeve with respect to the manifold, said opening in the manifold communicates with the opening in the sleeve to effect a hot gas jet passage from the hot gas supply to the nozzle opening via the inlet bore, the manifold, and the nozzle and, in a second rotated position of the sleeve with respect to the manifold, communication between the opening in the manifold and the opening in the sleeve is substantially blocked to thus prevent formation of said hot gas jet passage.

26. A tip as in claim 25 wherein said inlet bore of the tip is removably mountable with respect to the hot as supply.

27. A tip as in claim 25 wherein said sleeve of the nozzle means is removably mountable with respect to the manifold.

28. A tip as in claim 25 where said inlet bore and said manifold are aligned.

29. A tip as in claim 25 where said inlet bore and said manifold are at an angle with respect to one another.

30. A tip as in claim 25 where said manifold means includes only one manifold.

31. A tip as in claim 25 where said manifold means includes at least two of said manifolds.

32. A tip as in claim 31 where said two manifolds are orthogonally disposed with respect to each other to thus provide the capability of hot gas jets at adjacent sides of said component.

33. A tip as in claim 31 where said two manifolds are disposed in parallel with respect to each other to thus provide the capability of hot gas jets at opposite sides of said component.

34. A tip as in claim 33 where only one said nozzle means is mounted on each said manifold.

35. A tip as in claim 33 where said inlet bore is bifurcated, said two manifolds being connected to the bifurcated ends of the inlet bore.

36. A tip as in claim 33 where the distance between the two parallel manifolds is such that a plurality of different sizes of said component can be installed or removed by the tip without having to rotate the nozzles past about 45° with respect to the vertical.

37. A tip as in claims 30, 31, 32, or 33 including only one said nozzle means mounted on at least one manifold.

38. A tip as in claim 37 where the size of the nozzle opening is such that the solder associated with only one terminal of the component can be reflowed.

39. A tip as in claims 30, 31, 32, or 33 including a plurality of said nozzle means rotatably mountable on at least one manifold.

40. A tip as in claim 39 where the size of the nozzle openings of said nozzle means vary to facilitate the installation or removal of plurality of different components.

41. A tip as in claim 39 including a plurality of said openings in the side of said one manifold which are respectively associated with said plurality of nozzle means.

42. A tip as in claims 30, 31, 32, or 33 where the size of the nozzle opening is sufficient to reflow solder associated with more than one terminal at the side of the component.

43. A tip as in claims 30, 31, 32, or 33 where the size of the nozzle opening is such that the solder associated with only one terminal of the component can be reflowed.

44. A tip as in claims 30, 31, 32, or 33 where the shape of the nozzle is such that the air flow path along the length thereof and out the nozzle opening is substantially linear.

45. A tip as in claims 30, 31, 32, or 33 where the shape of the nozzle is such that the air flow path at some portion along the length thereof is curvilinear.

46. A tip as in claim 45 where said nozzle is curved in the proximity of the nozzle opening.

47. A tip as in claim 45 where the curvature in the nozzle is such that the air flow is curved through approximately 90°.

* * * * *